United States Patent [19]

Dingle et al.

[11] E Patent Number: Re. 33,671

[45] Reissued Date of Patent: Aug. 20, 1991

[54] METHOD OF MAKING HIGH MOBILITY MULTILAYERED HETEROJUNCTION DEVICE EMPLOYING MODULATED DOPING

[75] Inventors: Raymond Dingle, Summit, N.J.; Charles Gossard, Santa Barbara, Calif.; Horst L. Stormer, Summit, N.J.

[73] Assignee: AT&T Bell Laboratories, Murray Hill, N.J.

[21] Appl. No.: 58,668

[22] Filed: May 26, 1987

Related U.S. Patent Documents

Reissue of:

[64] Patent No.: 4,194,935
Issued: Mar. 25, 1980
Appl. No.: 26,090
Filed: Apr. 2, 1979

U.S. Applications:

[60] Continuation of Ser. No. 657,051, Oct. 3, 1984, abandoned, which is a continuation of Ser. No. 336,294, Dec. 31, 1981, abandoned, which is a division of Ser. No. 899,402, Apr. 24, 1978, Pat. No. 4,163,273.

[51] Int. Cl.[5] ..... H01L 21/203; H01L 29/38

[52] U.S. Cl. ..... 437/107; 148/DIG. 67; 148/DIG. 72; 148/DIG. 160; 148/DIG. 169; 156/610; 156/612; 357/4; 357/16; 357/17; 357/22; 357/23.2; 357/88; 357/90; 372/45; 437/40; 437/110; 437/128; 437/133; 437/913; 437/969

[58] Field of Search ..... 437/40, 107, 110, 128, 437/133, 913, 969; 156/610, 612; 357/4, 16, 17, 23.2, 88, 89; 372/45; 148/DIG. 67, DIG. 72, DIG. 169, 169

[56] References Cited

U.S. PATENT DOCUMENTS

| | | | |
|---|---|---|---|
| 3,626,257 | 12/1971 | Esaki et al. | 357/88 X |
| 3,626,328 | 12/1971 | Esaki et al. | 357/16 X |
| 3,721,583 | 3/1973 | Blakeslee | 148/175 X |
| 3,737,737 | 6/1973 | Heywang et al. | 357/18 |
| 3,758,875 | 9/1973 | Hayashi | 357/17 X |
| 3,838,359 | 9/1974 | Hakki et al. | 331/94.5 H |
| 3,882,533 | 5/1975 | Döhler | 357/17 X |
| 3,911,376 | 10/1975 | Thompson | 372/45 |
| 3,915,765 | 10/1975 | Cho et al. | 148/175 |
| 4,016,505 | 4/1977 | Itoh et al. | 357/16 X |
| 4,088,515 | 5/1978 | Blakeslee et al. | 148/175 |
| 4,103,312 | 7/1978 | Chang et al. | 357/16 |
| 4,137,542 | 1/1979 | Chang et al. | 357/88 X |
| 4,141,025 | 2/1979 | Bronshtein et al. | 357/16 X |
| 4,169,997 | 10/1979 | Logan et al. | 331/94.5 H |

FOREIGN PATENT DOCUMENTS 2607940 9/1977 Fed. Rep. of Germany .

OTHER PUBLICATIONS

Chang et al., "Smooth and Coherent Layers of GaAs and AlAs . . . Epitaxy", Appl. Physics Letter, vol. 28, No. 1, Jan. 1, 1976, pp. 39-41.

Luscher, P. E., "Crystal Growth by Molecular Beam Epitaxy", Solid State Technology, vol. 20, No. 12, Dec. 1977, pp. 43-52.

Cho et al., "Continuous Room-Temperature . . . Lasers Prepared by . . . Epitaxy", Appl. Physics Letters, vol. 28, No. 9, May 1, 1976, pp. 501-503.

Chang et al., "New Type of Superlattice", I.B.M. Tech. Discl. Bull., vol. 20, No. 6, Nov. 1977, pp. 2452-2453.

Chang et al., "Molecular-Beam Epitaxy (MBE) of $In_{1-x}Ga_xAs$ and $GaSb_{1-y}As_y$", Appl. Physics Letters, vol. 31, No. 11, Dec. 1, 1977, pp. 759-761.

Lang et al., "Large-Lattice-Relaxation Model . . . in Compound Semiconductors", Physical Review Letters, vol. 39, No. 10, Sep. 5, 1977, pp. 635-639.

*Primary Examiner*—William G. Saba
*Attorney, Agent, or Firm*—Scott W. McLellan

[57] ABSTRACT

The mobility of a relatively narrow bandgap semiconductor material can be significantly enhanced by incorporating it into a multilayered structure (10) comprising a first plurality of relatively narrow bandgap layers (12) of the material and a second plurality of wider bandgap semiconductor layers (14) interleaved with and contiguous with the first plurality. The wide bandgap and narrow bandgap layers are substantially lattice-matched to one another, and the wide bandgap layers are doped such that the impurity concentration-thickness product therein is greater than the same product in the narrow bandgap layers. The fabrication of the structure by MBE to enhance the mobility of GaAs is specifically described. In this case, the narrow bandgap layers (12) comprise GaAs and are unintentionally doped to about $10^{14}/cm^3$, whereas the wide bandgap layers (14) comprise AlGaAs doped n-type to about $10^{16}$ to $10^{18}/cm^3$. The incorporation of this structure in an FET is also described.

8 Claims, 3 Drawing Sheets

METHOD OF MAKING HIGH MOBILITY MULTILAYERED HETEROJUNCTION DEVICE EMPLOYING MODULATED DOPING

Matter enclosed in heavy brackets [ ] appears in the original patent but forms no part of this reissue specification; matter printed in italics indicates the additions made by reissue.

[This application is a division of application Ser. No. 899,402, filed Apr. 24, 1978, now U.S. Pat. No. 4,163,273.] *This application is a continuation of Ser. No. 06/657/051, filed 10/03/84, now abandoned, which is a continuation of Ser. No. 06/336,294, filed 12/31/81, now abandoned, which is a Reissue of Ser. No. 05/026/090, filed 04/02/79, now U.S. Pat. No. 4,194,935, which is a divisional of Ser. No. 05/899,402, filed 04/24/78, now U.S. Pat. No. 4,163,273.*

TECHNICAL FIELD

This invention relates to semiconductor devices with enhanced mobility.

PRIOR ART

The following U.S. Pat. Nos. are representative of the prior art in the area of multilayered semiconductor devices: 3,626,257 of Esaki et al suggests various kinds of superlattices made by modulating the bandgap or doping so that the multilayered structure exhibits negative resistance; 3,737,737 of Heywang et al suggests the use of a multilayered structure with modulated doping for lowering the threshold of a semiconductor junction laser; and 3,882,533 of Dohler suggests that modulated doping of a prescribed type may be useful in light emitting devices, but Dohler puts carriers in regions having a high concentration of impurity scattering centers.

BACKGROUND OF THE INVENTION

In an ideal intrinsic semiconductor mobility is determined by lattice scattering; that is, collisions between lattice waves (phonons) and electron waves (electrons). In an actual intrinsic specimen there are always some impurity atoms which may dominate scattering at low temperatures when phenons are quiescent, but at higher temperatures lattice scattering, particularly by optical phonons, is dominant. At cryogenic temperatures (e.g., $T=4$ to 77 K) ionized impurity scattering does indeed dominate mobility and, in fact, for a given impurity concentration follows a $T^{3/2}$ law for a uniformly doped sample. In addition, the theory of Brooks and Herring predicts, and an experiment confirms, that as a result of electron-electron scattering at a given temperature, mobility decreases with increasing impurity concentration, and for each doping level there is a theoretical maximum mobility. Finally, it is known that, in general, the mobility of electrons (and hence n-type semiconductors) is greater than the mobility of holes (and hence p-type semiconductors).

A highly doped n-type semiconductor, therefore, typically suffers from low mobility both at low temperatures (e.g., 4 K) due to ionized-impurity scattering from donors used to dope the specimen, and at high temperatures (e.g., 300 K) due to electron-electron scattering and electron-phonon scattering. Thus, the highest mobility semiconductors tend to be low doped so as to reduce both electron-electron scattering and ionized-impurity scattering. But low doping levels cause commensurately low conductivity at room temperature due to a dearth of carriers and at cryogenic temperatures due to carrier freeze-out.

Consider the compound semiconductor GaAs is an example. N-type samples typically exhibit room temperature mobilities of about 6,800 to 2,800 $cm^2V^{-1}sec^{-1}$ for doping levels of $10^{15}$ to $10^{18}/cm^3$. But mobility is highly temperature dependent. A GaAs sample doped to $10^{17}/cm^3$ may have a mobility of several thousand at room temperature, but at liquid helium temperatures the mobility may be less than a hundred. Extremely high mobilities in GaAs (e.g., $10^5$ $cm^2V^{-1}sec^{-1}$) have been attained by vapor phase epitaxy in isolated cases by utilizing extremely low doped samples (e.g., $10^{13}/cm^3$). As mentioned previously, however, GaAs with such low doping levels suffers from low conductivity.

SUMMARY OF THE INVENTION

We have discovered that the mobility of semiconductors in general, and GaAs in particular, can be enhanced considerably by fabricating the semiconductor in the form of a first plurality of relatively narrow bandgap semiconductor layers and separating these layers with a second plurality of wider bandgap semiconductor layers which are interleaved with and contiguous with the first plurality. The layers should exhibit a conduction or valence band step sufficiently large to confine electrons or holes, respectively, to the narrow bandgap layers. In addition, adjacent narrow and wide bandgap layers are substantially lattice-matched so that the hetero junctions formed at the interfaces therebetween are substantially defect free. An essential feature is that the wide bandgap layers are doped such that the impurity concentration-thickness product therein is greater than the same product in the narrow bandgap layers. Preferably, the narrow bandgap layers are undoped or unintentionally doped and the wide bandgap layers are doped n-type to a level which satisfies the foregoing product criterion.

For example, GaAs layers, which are grown by molecular beam epitaxy (MBE) and which are unintentionally doped, typically exhibit a carrier concentration of about $10^{14}/cm^3$ resulting from background contamination. These GaAs layers may be either n-type, p-type or compensated depending upon the previous history of the ultra high vacuum system used to fabricate the layers and the composition of the molecular beams. In the case of GaAs narrow bandgap layers, the second plurality of wide bandgap layers preferably comprise AlGaAs doped n-type to about $10^{16}$ to $10^{18}/cm^3$.

Regardless of which semiconductors are utilized to fabricate the first and second plurality of layers, however, the effect of the multilayered structure is to produce a potential well into which carriers flow from the adjacent wide bandgap layers; that is, the wide bandgap layers become depleted of carriers which accumulate in the narrow bandgap layers as the multilayered structure is being fabricated. Because the narrow bandgap layers are undoped or unintentionally doped, the number of ionized impurities therein is extremely small compared to the number of carriers which will accumulate therein as long as the wide bandgap layers are doped such that the impurity concentration-thickness product therein exceeds the same product in the narrow bandgap layers. As a result, the carriers, which are confined to the narrow bandgap layers by the heterojunctions formed at the interfaces with the adjacent wide bandgap layers, experience relatively little scattering from ionized impurities, and the multilayered structure as a whole exhibits generally higher mobilities than are attainable in bulk samples of the narrow bandgap semiconductor material. However, because the heterojunctions barriers are not infinitely high in energy, there is a finite quantum-mechanical probability that carriers may penetrate a few Angstroms into the wide bandgap material where ionized impurities are present. Thus, to further reduce ionized impurity scattering, and further enhance mobility, in the event that such carrier penetration should occur, it is a feature of an alternative embodiment of our invention that the doping of the wide bandgap layers be terminated short of the heterojunctions so as to leave thin (e.g., 10–60 Angstroms) buffer zones substantially free of impurities adjacent the heterojunctions. This feature also reduces the likelihood that impurities in the wide bandgap layers will diffuse into the narrow bandgap layers where they would increase scattering.

For example, MBE-grown multilayered structures in accordance with one embodiment of our invention comprise n-AlGaAs wide bandgap layers and unintentionally doped GaAs narrow bandgap layers. In different structures the AlGaAs layers were doped to about $10^{16}$ to $10^{18}/cm^3$, whereas the GaAs layers were unintentionally doped to about $10^{14}/cm^3$. Doping in the AlGaAs layers was terminated about 10–60 Angstroms from the heterojunctions. The structures as a whole exhibited room temperature mobilities between about 6,000 and 4,000 $cm^2V^{-1}sec^{-1}$, entirely above the theoretical maximum predicted by the Brooks-Herring theory. Similarly, the same structure in which the AlGaAs layers were doped n-type to about $10^{17}/cm^3$ exhibited a mobility of 16,000 at liquid helium temperatures and 6,000 at room temperature. In contrast, a multilayered structure with similar dimensions, but with uniform doping throughout, exhibited a mobility of about 100 at liquid helium temperature and 2,500 at room temperature.

It is clear, therefore, that modulating the doping and the bandgap of a multilayered structure in accordance with our invention considerably enhances the mobility as compared to that attainable in the bulk narrow bandgap material over broad temperature ranges, especially near 4 K and 300 K. Such a structure may find application in forming the channel of a field effect transistor (FET) as described hereinafter.

BRIEF DESCRIPTION OF THE DRAWINGS

Our invention, together with its various features and advantages, can be readily understood from the following more detailed description taken in conjunction with the following drawing, in which.

DETAILED DESCRIPTION

Figure 1:
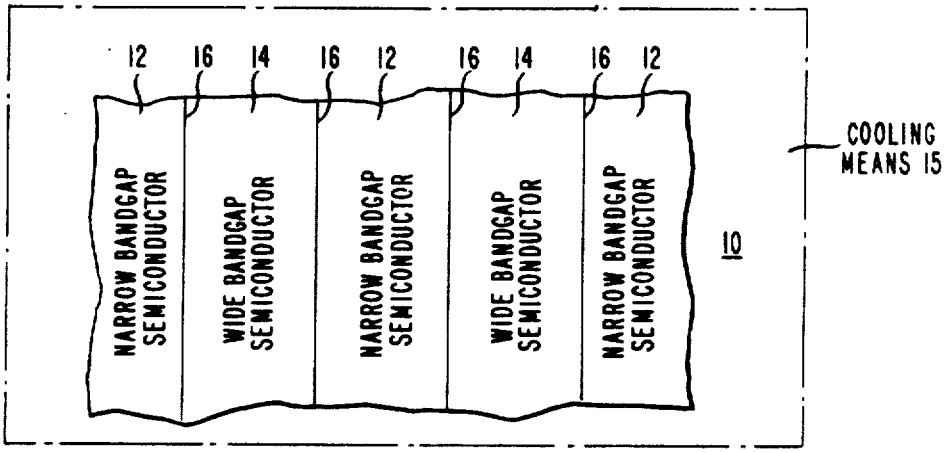
FIG. 1 shows a multilayered structure of alternating wide bandgap and narrow bandgap semiconductor layers.

With reference now to FIG. 1, a multilayered semiconductor structure 10 in accordance with one embodiment of our invention comprises a first plurality of relatively narrow bandgap semiconductor layers 12 and a second plurality of wider bandgap semiconductor layers 14 interleaved with and contiguous with the first plurality. In order to reduce interface states at the heterojunctions 16 between adjacent narrow and wide bandgap layers, the layers 12 and 14 are preferably made of substantially lattice-matched materials. When the wide bandgap layers are n-type, the materials of the layers should be chosen such that a step $\Delta E_c$ is produced in the conduction band of sufficient magnitude (e.g., at least several times kT) to confine electrons to the narrow bandgap layers. Conversely, when they are p-type a similar step $\Delta E_v$ would be required in the valence band to confine holes. However, n-type wide bandgap layers are preferred because electron mobility generally exceeds hole mobility.

In accordance with our invention, it is an essential feature, in order to reduce carrier scattering by ionized impurities in the narrow bandgap layers, that the product of the impurity concentration times the thickness of the wide bandgap layers 14 exceed that product for the narrow bandgap layers 12. In the case where the thicknesses of the narrow and wide bandgap layers are equal, the criterion reduces to requiring the impurity concentration of the wide bandgap layers to exceed that of the narrow bandgap layers.

The amount by which the impurity concentration-thickness product of the wide bandgap layers should exceed that of the narrow bandgap layers depends on the degree of enhanced mobility desired and the number of interface traps at the heterojunctions. The higher the desired mobility and the larger the number of such traps (which are related to the degree of lattice mismatch), the larger should be the difference between the impurity concentration-thickness products of the wide and narrow bandgap layers. Thus, for some applications a product ratio of 2:1 may be adequate whereas in another case a ratio $10^4$:1 may be desired. Our experiments have confirmed mobility enhanced for ratios of $10^2$:1 to $10^4$:1.

It should be noted that the structure 10 need not be periodic; that is, while each pair of adjacent layers should satisfy the above conditions, each pair need not be identical in thickness, doping level or bandgap to any other pair of layers in the structure.

Figure 2:
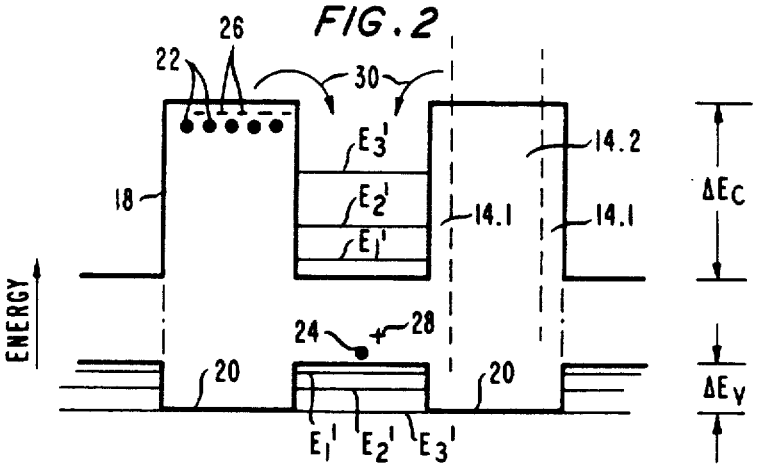
FIG. 2 shows the energy band diagram for the structure of FIG. 1 before electrons are depleted from the wide bandgap layers.

The energy band diagram shown in FIG. 2 corresponds to the structure of FIG. 1 for n-type wide bandgap layers 14 before electrons move into the narrow bandgap layers. To this extent, FIG. 2 is unrealistic because as soon as two layers are brought into contact with one another during the fabrication process, electrons move essentially instantaneously from the wide bandgap layer into the adjacent narrow bandgap layer in order to satisfy the requirement of a continuous Fermi level $E_f$(FIG. 3) throughout the structure. Nevertheless, FIG. 2 is included to facilitate an understanding of the physical mechanisms at play in the structure 10. Thus, the upper crenel-shaped line 18 represents the conduction band and the lower crenel-shaped line 20 represents the valence band. However, only the conduction band steps $\Delta E_c$ are required to confine electrons. The black dots represent donors 22 in the conduction band and acceptors 24 in the valence band, and the horizontal dashed lines in the conduction band represent electrons 26, whereas the cross in the valence band represent holes 28.

The thicknesses of the narrow and wide bandgap layers 12 and 14 are shown to be equal for illustrative purposes only. If the thickness of the narrow bandgap layers 12 is of the order of a few hundred Angstroms or less, the energy levels therein will be quantized as represented by the conduction band levels $E_1$, $E_2$, and $E_3$ and the valence band levels $E_1'$, $E_2'$ and $E_3'$.

Modulated doping in these layers is schematically depicted by a larger number of donor symbols 22 (five) in the wide bandgap layer 14 than the number of donor symbols (none) or acceptor symbols 28 (one) in the narrow bandgap layers 12. This energy band diagram, therefore, indicates that the narrow bandgap layer is slightly p-type, a situation that sometimes arises in the growth, for example, of unintentionally doped GaAs by MBE. Whether the narrow bandgap layer is n-type, p-type or compensated, however, may depend on the prior history of the growth apparatus or the molecular beam composition, but in any case the important consideration is that the impurity concentration in the wide bandgap layers exceed that in narrow bandgap layers.

For purposes of definition, we use the term unintentionally doped to mean that during fabrication no controlled doping source is utilized to insure the presence of a particular doping level of donors or acceptors in the narrow bandgap layers. To the extent, therefore, that these layers are in fact doped, it results from background contamination. In addition, in the terms narrow and wide bandgap layers the bandgaps of the layers 12 and 14 are compared to one another (i.e., the bandgap difference produces the requisite conduction or valence band step $\Delta E_c$ or $\Delta E_y$) and so are not narrow or wide in any absolute sense.

Figure 3:
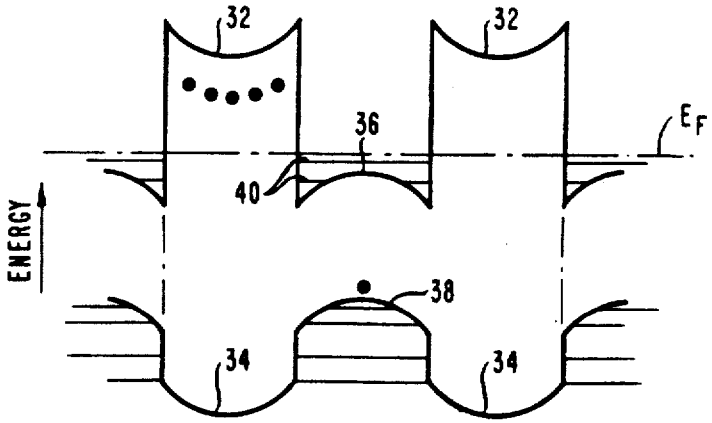
FIG. 3 is an energy band diagram for the structure of FIG. 1 showing band bending after electrons are depleted from the wide bandgap layers and accumulate in the narrow bandgap layers.

As mentioned previously, electrons and holes do not occupy the positions shown in FIG. 2 because, as soon as the narrow and wide bandgap layers are in contact with one another during the growth process, electrons [22] *26* are depleted from the wide bandgap layers 14 and accumulate in the potential wells formed by the narrow bandgap layers 12. The flow of electrons in the conduction band, which is depicted by the arrows 30 in FIG. 2, results in band bending as shown in FIG. 3. That is, the depletion of electrons from the wide bandgap layers 14 causes a downward bending in the conduction band 32 and valence band 34 of these layers. In contrast, the accumulation of electrons in the narrow bandgap layers 12 produces a corresponding upward bending in the conduction band 36 and the valence band 38. The accumulation of electrons in narrow bandgap layer 12 fills the energy states (e.g., states at 40) below the Fermi level $E_F$.

In essence, therefore, the modulated conduction band of the structure 10 results in a depletion of electrons from the wide bandgap layers and accumulation of those electrons in the narrow bandgap layers. The modulated doping of the structure 10, on the other hand, insures that the electrons which accumulate in the narrow bandgap layers exhibit greatly reduced ionized impurity scattering. As a result, the structure 10 as a whole exhibits significantly enhanced mobility. As mentioned previously, however, the heterojunction barriers are not infinitely high (in energy) so that there is a finite quantum-mechanical probability for electrons to penetrate a few Angstroms into the wide bandgap layers. Such electrons could therefore experience ionized impurity scattering by donors near the heterojunctions. To reduce the likelihood of such scattering, and further enhance mobility, it is a feature of another embodiment of our invention that, in each wide bandgap layer 14, doping is terminated short of the heterojunctions so as to leave thin buffer zones 14.1 substantially free of ionized impurities. Thus, only the central portion 14.2 of each wide bandgap layer is doped. This feature also reduces the likelihood that impurities in the wide bandgap layers 14 will diffuse into the narrow bandgap layers 12 where they increase scattering. Thus, it is also preferable to dope the wide bandgap layers 14 with slow diffusing impurities (e.g., Si for AlGaAs), and to grow the layers by MBE since it enables abrupt changes in doping and utilizes low growth temperatures.

EXAMPLE

We have fabricated several structures of the type shown in FIG. 1 utilizing molecular beam epitaxy to grow n—$Al_xGa_{1-x}As$ (x=0.2 to 0.35) wide bandgap layers 14 and unintentionally doped GaAs layers 12. Due to background contamination, the GaAs layers would tend to have an impurity concentration of about $10^{14}/cm^3$. The AlGaAs layers, on the other hand, were doped with Si in different structures to levels ranging between about $10^{16}$ to $10^{18}/cm^3$. Doping in some structures was terminated 10–60 Angstroms short of the heterojunctions. Also in different structures, the thickness of the layers ranged from 100 to 400 Angstroms, but in each the thicknesses of wide and narrow bandgap layers were equal and the impurity concentration-thickness ratios ranged from $10^2$:1 to $10^4$:1. The results which follow, however, were found to be substantially independent of layer thickness of this range.

Figure 4:
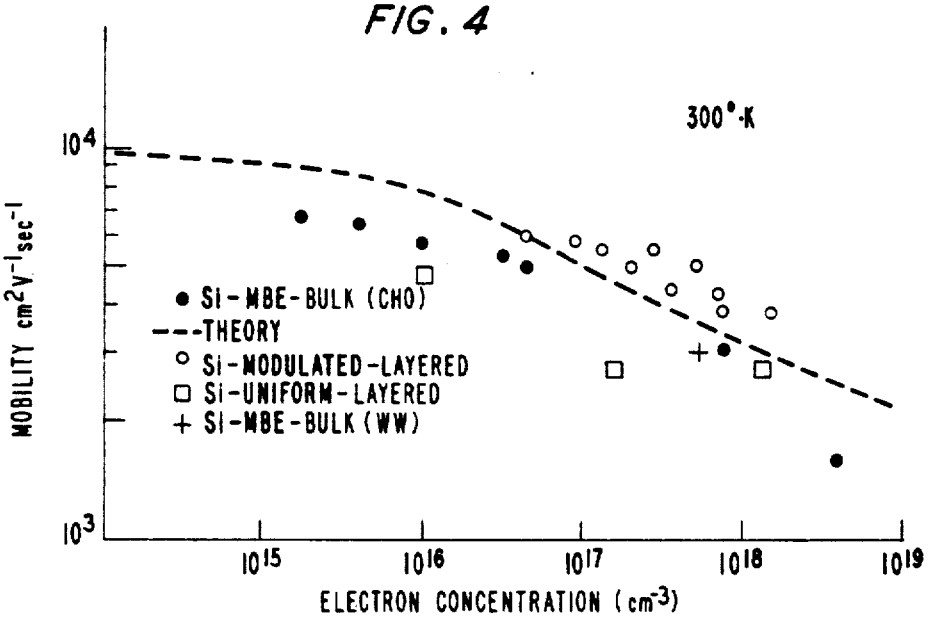
FIG. 4 is a graph of room temperature mobility versus electron concentration for multilayered structures with uniform and modulated doping, and for bulk n-GaAs grown by MBE. These data are compared with the maximum predicted by the Brooks-Herring theory (dashed line)

Some of the results are plotted in FIG. 4 and compared with GaAs grown by other techniques. The dashed line, which results from the Brooks-Herring theory, predicts the maximum mobility for n-type GaAs at room temperature over the doping range from $10^{14}$ to $10^{19}/cm^3$. In the prior art, A. Y. Cho has grown n-type, Si-doped GaAs epitaxial layers by MBE on n-type GaAs substrates and has measured the mobility which is shown by the black dots. W. Wiegmann has grown similar layers depicted by the cross data point. Similar results have been obtained for n-type, Te-doped GaAs grown by liquid phase epitaxy. The significance of this prior art data is that in all cases the mobilities fell below the theoretical maximum predicted by the Brooks-Herring theory.

For comparison purposes, we fabricated a structure analogous to that shown in FIG. 1 using GaAs and $Al_xGa_{1-x}As$ (x=0.27) with uniform doping throughout; that is, the GaAs and AlGaAs layers were all doped with Si to substantially the same level (about $10^{18}/cm^3$). The mobility of this structure also fell below the theoretical maximum as shown by the square data point on FIG. 4. In contrast, the mobilities for GaAs-AlGaAs multilayered structures with modulated bandgap and doping as prescribed by our invention all exhibited mobilities above the theoretical maximum as shown by the open circle data points of FIG. 4. It should be noted that although these data points appear to be close to those of the prior art, they are considerably higher because the ordinate scale is logarithmic.

Figure 5:
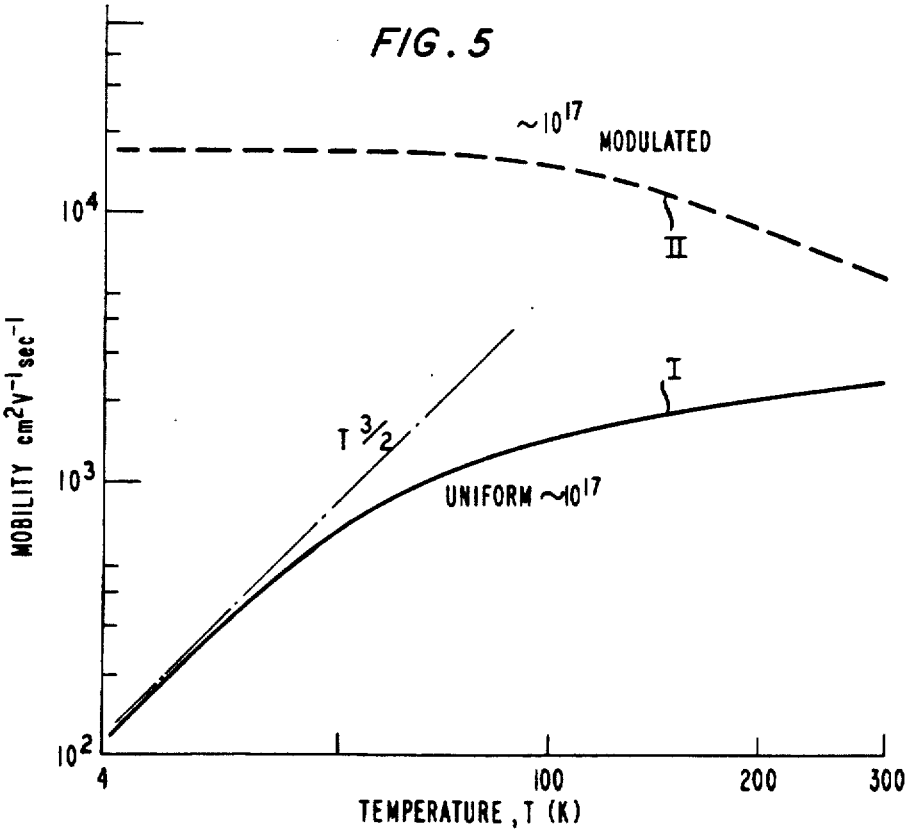
FIG. 5 is a graph of mobility versus temperature for a multilayered GaAs-AlGaAs structure with uniform doping throughout (curve I) compared to a similar structure but with modulated doping in accordance with our invention (curve II)

While FIG. 4 shows how mobility varies with doping level at a given temperature, it is also important to know how mobility varies with temperature at a given doping level. Temperature was controlled by cooling means 15 (e.g., cryogenic apparatus) shown schematically in FIG. 1 as surrounding device 10. Thus, FIG. 5, curve I, shows the mobility-temperature variation for a multilayered structure of GaAs-$Al_xGa_{1-x}As$ ($x=0.30$) doped with Si uniformly throughout to a level of about $10^{17}/cm^3$. At room temperature, the mobility of the uniformly doped structure was about, 2,500 $cm^2\ V^{-1}\ sec^{-1}$ and decreased drastically with temperature to about 100 $cm^2\ V^{-1}\ sec^{-1}$ at liquid helium temperatures. Another uniformly doped (about $6\times10^{17}/cm^3$) multilayered structure had somewhat higher mobilities at 77 K and 300 K. As with bulk GaAs samples, in the cryogenic temperature range the mobility of the $10^{17}/cm^3$ uniformly doped sample decreased as $T^{3/2}$ which is characteristic of ionized impurity scattering. However, a similar structure ($x=0.26$) fabricated in accordance with our invention with modulated doping and bandgap, exhibited much higher mobilities as shown by curve II of FIG. 5. At room temperature, the mobility was about 6,000 $cm^2\ V^{-1}\ sec^{-1}$, nearly 2.5 times greater than that of the uniformly doped multilayered sample. Moreover, as the temperature was decreased, the mobility dramatically increased to about 10,000 $cm^2\ V^{-1}\ sec^{-1}$ at about 150 K and to 16,000 $cm^2\ V^{-1}\ sec^{-1}$ at 50 K and below, more than 200 times greater than that of the uniformly doped sample. The dramatic increase of mobility with decreasing temperature was evidence of the efficacy of our structure to substantially reduce the adverse effects of ionized impurity scattering on mobility.

Figure 6:
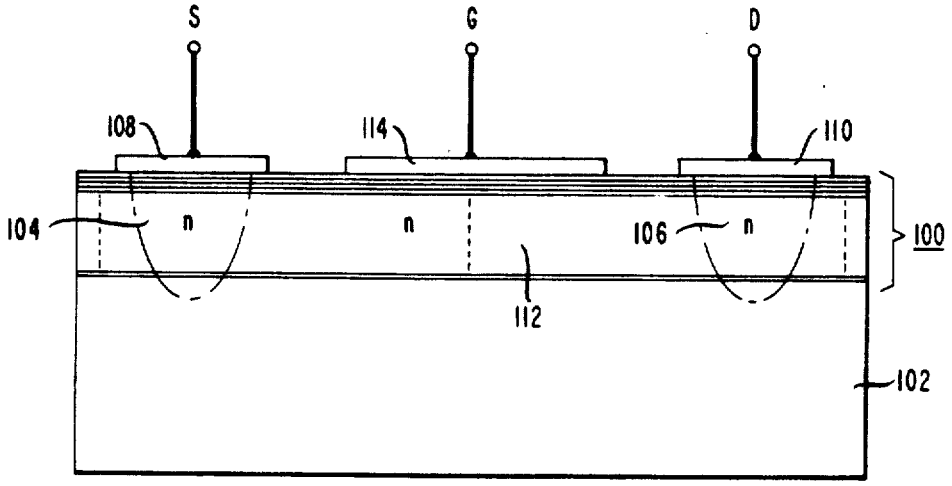
FIG. 6 is a schematic cross-sectional view of a MESFET incorporating a multilayered structure with modulated doping and bandgap in accordance with an other embodiment of our invention.

The high mobility of our invention can be exploited in a number of devices such as the FET shown in FIG. 6.

FET Devices

In general, a MESFET includes separated source and drain regions coupled by a channel in which depletion is created by voltage applied to an overlying gate electrode. Typically, when no voltage is applied to the gate, current flows between the source and drain, but when a voltage of suitable magnitude and polarity is applied, depletion (i.e., pinch-off) occurs in the channel and current flow between the source and drain is interrupted.

In the MESFET devices shown in FIG. 6, a multilayered semiconductor structure 100 having modulated doping and bandgap in accordance with the previous description is epitaxially grown on a semi-insulating substrate 102. Since the wide bandgap layers of the structure 100 are preferably n-type in order to exploit the higher mobility of electrons compared to holes, the source zone 104 and drain zone 106 are typically formed by diffusing, implanting or otherwise placing donors in localized zones 104 and 106 which extend at least through the structure 100 to the substrate 102. Source and drain electrodes 108 and 110 are then deposited by conventional techniques over the zones 104 and 106, respectively. The portion 112 of structure 100 which is located between source and drain zones 104 and 106 forms the channel of the FET. Gate electrode 114 is formed as a Schottky barrier contact directly on the channel. When a negative voltage is applied to the gate electrode 114, the channel is depleted and no conduction occurs between source 104 and drain 106. Conversely, when no voltage is applied to the gate, conduction occurs between the source and drain, thus exploiting the enhanced mobility of the multilayered channel 112.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, while our invention has been described with specific reference to a GaAs-AlGaAs example, it will be obvious that other lattice-matched materials which exhibit sufficiently large conduction or valence bans steps are also suitable; for example, $Al_yGa_{1-y}As$—$Al_xGa_{1-x}As$ ($0\pm y$, $x-y\geqq0.02$ to yield a sufficiently large $\Delta E_c$), GaAs-AlGaAsP: InP-InGaAsP; InP-InGaAs; or InAs-GaAsSb.

It will also be appreciated that our invention, viewed from another aspect, is a method for enhancing the mobility of a given narrow bandgap semiconductor material by fabricating the narrow bandgap material in the form of a first plurality of spaced layers which are undoped or unintentionally doped and fabricating a second plurality of wide bandgap semiconductor layers contiguous with and interleaved with the narrow bandgap layers from a material which is substantially lattice-matched to the narrow bandgap layers, and is doped such that the impurity concentration-thickness product of the wide bandgap layers exceeds that of the narrow bandgap layers. When utilizing molecular beam epitaxy to perform this process, the Knudsen cells or ovens containing dopant source material for the wide bandgap layers would be shuttered closed during the growth of the narrow bandgap layers so that any impurities incorporated into the narrow bandgap layers would result primarily from background contamination in the ultra high vacuum system.

We claim:

1. A method of enhancing the mobility of a narrow bandgap semiconductor material comprising the steps of:

(a) forming said narrow bandgap material is a first plurality of spaced apart, narrow bandgap semiconductor layers, (b) forming a second plurality of wide bandgap semiconductor layers interleaved with and contiguous with said first plurality, and (c) forming said wide bandgap layers from a material which (i) is substantially lattice-matched to that of said narrow bandgap layers (ii) forms a conductor or valence band step at the interfaces with said narrow bandgap layers of sufficient magnitude to confine carriers, and (iii) is doped such that the impurity-concentration-thickness product thereof exceeds that of said narrow bandgap layers.

2. The method of claim 1 wherein said forming steps include growing said layers by molecular beam epitaxy in an ultra high vacuum chamber wherein said first and second pluralities of layers are grown alternately on a semiconductor substrate.

3. The method of claim 2 wherein said chamber includes an oven carrying a dopant source which is used to generate a donor beam for doping said wide bandgap layers n-type and which is shuttered closed during the growth of said narrow bandgap layers so that impurities are incorporated in said narrow bandgap layers primarily from background contamination in said chamber.

4. The method of claim 3 wherein said forming step (a) is effective to grow said first plurality of [GaSa] *GaAs* layers having an impurity concentration of about $10^{14}$ or less, and said forming steps (b) and (c) are effective to grow said second plurality of n-type $Al_x$-$Ga_{1-x}As$ layers $0.02 \cong x$ having a donor concentration of at least $10^{16}/cm^3$.

5. The method of claim 1 wherein said forming steps (b) and (c) are effective to dope only a central portion of each of said wide bandgap layers with donors, thereby leaving a thin, undoped buffer zone in said wide bandgap layers adjacent said narrow bandgap layers.

*6. A method of enhancing the mobility of a narrow bandgap semiconductor material comprising the steps of:*

*(a) forming said narrow bandgap material as a narrow bandgap first layer,*

*(b) forming an essentially undoped wide bandgap semiconductor second layer contiguous with one side of said first layer,*

*(c) forming a wide bandgap semiconductor third layer contiguous with said second layer,*

*(d) forming an essentially undoped wide bandgap semiconductor fourth layer contiguous with the other side of said first layer,*

*(e) forming a wide bandgap semiconductor fifth layer contiguous with said fourth layer,*

*(f) forming said layers from materials which (i) form a conduction or valence band step at the interfaces with said first layer of sufficient magnitude to confine carriers, and (ii) are doped such that the impurity-concentration thickness product at least one of of said third layer and said fifth layer exceeds that of said first layer, and*

*(g) forming electrode means electrically coupled to said layers and capable of causing said carriers to flow in said first layer in a direction essentially parallel to said interfaces.*

*7. A method of fabricating a field effect transistor comprising the steps of:*

*(a) forming a narrow bandgap semiconductor first layer which includes the channel of said transistor,*

*(b) forming a wide bandgap semiconductor second layer on one side of said first layer,*

*(c) forming a wide bandgap semiconductor third layer on the other side of said first layer,*

*(d) forming said layers from materials which (i) form a conduction or valence band step at the interfaces with said first layer of sufficient magnitude to confine carriers, and (ii) are doped such that the impurity-concentration thickness product of at least one of said second and third layers exceeds that of said first layer, and*

*(e) forming electrode means on said transistor including source and drain electrode means which are electrically coupled to said channel and gate electrode means for controlling the flow of carriers in said channel.*

*8. The method of claim 7 wherein said forming steps (a), (b), (c) and (d) are effective to dope only a portion of the doped ones of said second and third layers, thereby leaving thin undoped buffer zones in said second and third layers adjacent to said first layer.*

* * * * *